US010029909B2

(12) United States Patent
Van Kampen

(10) Patent No.: US 10,029,909 B2
(45) Date of Patent: Jul. 24, 2018

(54) NON-SYMMETRIC ARRAYS OF MEMS DIGITAL VARIABLE CAPACITOR WITH UNIFORM OPERATING CHARACTERISTICS

(71) Applicant: CAVENDISH KINETICS, INC., San Jose, CA (US)

(72) Inventor: Robertus Petrus Van Kampen, S-Hertogenbosch (NL)

(73) Assignee: CAVENDISH KINETICS, INC., San Jose, CA (US)

( * ) Notice: Subject to any disclaimer, the term of this patent is extended or adjusted under 35 U.S.C. 154(b) by 0 days.

(21) Appl. No.: 14/895,182

(22) PCT Filed: May 30, 2014

(86) PCT No.: PCT/US2014/040235
§ 371 (c)(1),
(2) Date: Dec. 1, 2015

(87) PCT Pub. No.: WO2015/009360
PCT Pub. Date: Jan. 22, 2015

(65) Prior Publication Data
US 2016/0115014 A1    Apr. 28, 2016

Related U.S. Application Data

(60) Provisional application No. 61/832,167, filed on Jun. 7, 2013.

(51) Int. Cl.
*H01C 7/22* (2006.01)
*H01C 1/028* (2006.01)
(Continued)

(52) U.S. Cl.
CPC ............ *B81B 3/0086* (2013.01); *H01G 5/16* (2013.01); *H01G 5/18* (2013.01); *H01G 5/38* (2013.01);
(Continued)

(58) Field of Classification Search
CPC ........ H01C 1/028; H01C 1/032; H01C 1/014; H01C 7/006; H01C 7/22; H01L 27/0802; H01L 27/101
See application file for complete search history.

(56) References Cited

U.S. PATENT DOCUMENTS

| 7,915,715 B2* | 3/2011 | Karim | .................. B81B 7/0064 |
| | | | 257/659 |
| 8,786,035 B2* | 7/2014 | Yamazaki | ............. B81B 3/0086 |
| | | | 257/415 |

(Continued)

FOREIGN PATENT DOCUMENTS

| CN | 101310206 A | 11/2008 |
| CN | 101986410 A | 3/2011 |

(Continued)

OTHER PUBLICATIONS

Chinese Office Action (with attached English translation) for Application No. 201480032389.6; dated Jul. 18, 2016; 13 total pages.

(Continued)

*Primary Examiner* — Marcos D Pizarro
*Assistant Examiner* — Shannon Yi
(74) *Attorney, Agent, or Firm* — Patterson & Sheridan, LLP; Steven Versteeg

(57) ABSTRACT

The present invention generally relates to a MEMS DVC. The MEMS DVC has an RF electrode and is formed above a CMOS substrate. To reduce noise in the RF signal, a poly-resistor that is connected between a waveform controller and the electrodes of the MEMS element, may be surrounded by an isolated p-well or an isolated n-well. The isolated well is coupled to an RF ground shield that is disposed between the poly-resistor and the MEMS element. Due to the presence of the isolated well that surrounds the poly-resistor, the substrate resistance does not influence the (Continued)

dynamic behavior of each MEMS element in the MEMS DVC and noise in the RF signal is reduced.

20 Claims, 16 Drawing Sheets

(51) Int. Cl.
 *B81B 3/00* (2006.01)
 *H01G 5/38* (2006.01)
 *H01G 5/18* (2006.01)
 *H01G 5/16* (2006.01)
 *H01H 59/00* (2006.01)

(52) U.S. Cl.
 CPC ... *B81B 2201/0221* (2013.01); *B81B 2203/04* (2013.01); *H01H 59/0009* (2013.01)

(56) References Cited

U.S. PATENT DOCUMENTS

| | | | | |
|---|---|---|---|---|
| 2003/0042567 | A1* | 3/2003 | Tilmans | B81B 7/0006 257/508 |
| 2004/0251940 | A1* | 12/2004 | Hayashi | H03K 19/018585 327/170 |
| 2007/0010052 | A1* | 1/2007 | Huang | H01L 21/823807 438/199 |
| 2007/0160234 | A1* | 7/2007 | Deruginsky | H02M 3/073 381/113 |
| 2008/0217149 | A1* | 9/2008 | Schmid | B81C 1/00246 200/181 |
| 2011/0024273 | A1 | 2/2011 | Akiba et al. | |
| 2011/0073960 | A1* | 3/2011 | Causio | H01L 21/823807 257/401 |
| 2011/0291167 | A1 | 12/2011 | Shimooka et al. | |
| 2012/0025851 | A1 | 2/2012 | Homeijer et al. | |
| 2012/0068308 | A1 | 3/2012 | Igeta et al. | |
| 2012/0119872 | A1* | 5/2012 | Leung | H01C 17/265 338/25 |
| 2012/0223613 | A1* | 9/2012 | Hung | B81C 1/00579 310/300 |
| 2013/0328633 | A1* | 12/2013 | Zhang | H03L 7/24 331/34 |
| 2014/0225228 | A1* | 8/2014 | Salcedo | H01L 27/0921 257/575 |

FOREIGN PATENT DOCUMENTS

| | | |
|---|---|---|
| JP | H10-163429 A | 6/1998 |
| WO | 2007/061406 A1 | 5/2007 |
| WO | 2011/001494 A1 | 12/2012 |
| WO | 2013033613 A2 | 3/2013 |

OTHER PUBLICATIONS

Japanese Office Action (with attached English translation of the Summary) for Application No. 2016-518357; dated Jan. 29, 2018; 5 total pages.

* cited by examiner

NON-SYMMETRIC ARRAYS OF MEMS DIGITAL VARIABLE CAPACITOR WITH UNIFORM OPERATING CHARACTERISTICS

BACKGROUND OF THE INVENTION

Field of the Invention

Embodiments of the present invention generally relate to a micro-electromechanical system (MEMS) digital variable capacitor (DVC).

Description of the Related Art

Some DVC devices are based on a movable MEMS element with a control-electrode above (i.e., a pull-up or pull-off or PU-electrode) and below (i.e., a pull-in or pull-down or PD-electrode) the movable MEMS element, as shown schematically in FIG. 1. In addition there is an RF-electrode below the movable MEMS element (i.e., plate or cantilever or movable plate electrode). During operation a voltage is applied to either the PU or PD-electrode, which causes the MEMS element to be pulled-up or pulled-down in contact to provide a stable minimum or maximum capacitance to the RF-electrode. In this way the capacitance from the movable element to the RF-electrode (which resides below the movable element) can be varied from a high capacitance $C_{max}$ when pulled to the bottom (See FIG. 2) to a low capacitance $C_{min}$ (See FIG. 3) when pulled to the top.

FIG. 4 shows how the MEMS DVC device is integrated in the Back-end-of-Line (i.e., BEOL) of a complementary metal oxide semiconductor (CMOS) process. A metal shield connected to RFGND (i.e., RF-ground) is placed underneath the MEMS DVC devices to shield the silicon substrate from the MEMS DVC device. This ensures that loss mechanisms in the silicon will not negatively impact the RF performance of the MEMS DVC devices. The metal shield is typically placed in the lower metal levels (e.g., $M_1$). Additional metal levels $M_2 \ldots M_{n-1}$ between the metal-shield and the RF-electrode (implemented in $M_n$) ensure that the parasitic capacitance between the RF and the ground shield is limited.

FIG. 5 shows a top-view of the PD-electrode and RF-electrode of a MEMS DVC cell. In a typical MEMS DVC cell, the RF connection is made at side A of the MEMS DVC cell while the other connections (GND, PU, PD) are made at side B of the MEMS DVC cell.

FIG. 6 shows how multiple MEMS DVC cells are arranged around the RF-pin for optimal RF-performance. The CMOS waveform controller that controls the state of the MEMS DVC devices is placed in the same chip, either off to the side or underneath the MEMS cells.

FIG. 7 schematically shows the electrical connection of the waveform controller to the MEMS DVC cells. The movable element is typically on DC-ground and the voltages applied to the PD-electrode (Vbottom) and to the PU-electrode (Vtop) are typically controlled to ensure a long-life stable performance of the MEMS DVC device. The resistors Rpd and Rpu provide for isolation between the RF-signals present on the PU and PD electrode and the CMOS drivers. This also ensures no CMOS noise is coupled into the RF electrode of the MEMS DVC cells. In addition these resistors provide for damping of the MEMS devices within the MEMS DVC cells which allows for fast operation. Typically, these resistors are generated with high-resistivity poly-silicon and values of these resistors range from 50 kΩ to 10 MΩ.

FIG. 8 shows a cross-section of the MEMS DVC device near side B of the MEMS DVC cell. A connection is made between the poly-resistor and the PD-electrode to allow the CMOS waveform controller to apply voltages to each MEMS DVC cell while maintaining the isolation between the RF-signals and the CMOS signals. A hole is created in the ground-shield to allow the connection to the poly-resistor Rpd. A similar connection is made between the PU-electrode and the poly-resistor Rpu. Any noise present in the CMOS substrate can couple into the poly-resistor and subsequently couple into the PD and PU-electrode. This noise can subsequently couple into the RF-electrode and impact the RF-performance of the device.

To limit the noise in the substrate near the MEMS devices, substrate ground-contacts can be avoided near the MEMS DVC devices, so that any CMOS noise generated in the CMOS waveform controller that sits adjacent to the MEMS devices in the chip (See FIG. 6) has to travel some distance through the CMOS substrate before it reaches the poly-resistor. Substrate ground-contacts are not required in the region of the MEMS devices since there are no active devices in the silicon substrate in this region.

Because of the large-value poly-resistors, parasitic capacitances from this poly-resistor can affect the dynamic behavior of the signals applied to the MEMS cell. The poly-resistor will have parasitic capacitances to both the RFGND-shield above it and the substrate below it. FIG. 9 shows a simplified equivalent circuit model of the poly-resistors Rpu, Rpd of a given MEMS DVC cell with parasitic capacitors Cshield to the RFGND-shield and parasitic capacitors Csub to the substrate. The voltages Vtop, Vbottom are generated by the CMOS waveform controller with respect to the CMOS ground, which is also tied to the substrate. Any current coupled to the substrate through Csub has to travel through the substrate for a certain distance before the actual CMOS ground reference point is reached, i.e. there is a given series resistance Rsub. The current coupled to the RFGND shield is effectively directly coupled to the CMOS ground because the RFGND is tied to the CMOS GND either inside or outside the chip (indicated by the dotted line).

In a typical CMOS process the coupling of the poly-resistors to the substrate Csub can be larger than the coupling of the poly-resistor to the metal-shield Cshield above the poly-resistors. This means that the dynamic response of the poly-resistors will depend on the values of Csub and Rsub.

Each MEMS cell in FIG. 6 has a poly-resistor near side B of the cell to provide RF-isolation and MEMS-damping. Since each MEMS cell is located at a different position inside the chip, the value of Rsub can vary greatly from cell to cell. This means the various cells will exhibit a different RF-isolation and damping and also a different dynamic actuation of the various MEMS-cells on the chip.

There is a need in the art to eliminate this variation and to improve the RF isolation further.

SUMMARY OF THE INVENTION

The present invention generally relates to a MEMS DVC. The MEMS DVC has an RF electrode and is formed above a CMOS substrate. To reduce noise in the RF signal, a poly-resistor that is connected between a waveform controller and the electrodes of the MEMS element, may be surrounded by an isolated p-well or an isolated n-well. The isolated well is coupled to an RF ground shield that is disposed between the poly-resistor and the MEMS element. Due to the presence of the isolated well that surrounds the poly-resistor, the substrate resistance does not influence the dynamic behavior of each MEMS element in the MEMS DVC and noise in the RF signal is reduced.

In one embodiment, a MEMS DVC comprises a substrate; a MEMS device disposed above the substrate, the MEMS device having an RF electrode and one or more other electrodes; a poly-resistor disposed between the substrate and the MEMS device and coupled to the MEMS device; a RF ground shield disposed between the MEMS device and the poly-resistor; a p-well contact disposed between the substrate and the poly-resistor, wherein the p-well contact is coupled to the RF ground shield; an isolated p-well coupled to the p-well contact and disposed between the substrate and the poly-resistor, wherein the p-well contact and the isolated p-well surround the poly-resistor; an n-well contact disposed between the substrate and the poly-resistor, wherein the n-well contact is coupled to the RF ground shield; and an n-well coupled to the n-well contact and disposed between the substrate and the isolated p-well, wherein the n-well contact and the n-well surround the p-well contact and the isolated p-well.

In another embodiment, a MEMS DVC comprises a MEMS device disposed above a substrate, the MEMS device having one or more electrodes; a first poly-resistor coupled to at least one of the one or more electrodes; an n-well surrounding the first poly-resistor; and an RF ground shield coupled to the n-well.

In another embodiment, MEMS DVC comprises a substrate; a deep n-well embedded within the substrate; a first isolated p-well disposed above the deep n-well; a first poly-resistor disposed above the isolated p-well and coupled to a MEMS device; and an RF ground shield disposed between the poly-resistor and the MEMS device, wherein the deep n-well and the isolated p-well are coupled to the RF ground shield.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present invention generally relates to a MEMS DVC. The MEMS DVC has an RF electrode and is formed above a CMOS substrate. To reduce noise in the RF signal, a poly-resistor that is connected between a waveform controller and the electrodes of the MEMS element, may be surrounded by an isolated p-well or an isolated n-well. The isolated well is coupled to an RF ground shield that is disposed between the poly-resistor and the MEMS element. Due to the presence of the isolated well that surrounds the poly-resistor, the substrate resistance does not influence the dynamic behavior of each MEMS element in the MEMS DVC and noise in the RF signal is reduced. As discussed herein, the isolation between the RF and the CMOS is improved, thereby improving the spurious noise in the RF-signal. Additionally, each MEMS cell will have an identical dynamic performance when programming/erasing the bit which makes it easier to match the switch times between cells in the array, which allows for an easier optimization of the switch-times of the MEMS cells.

Figure 1:
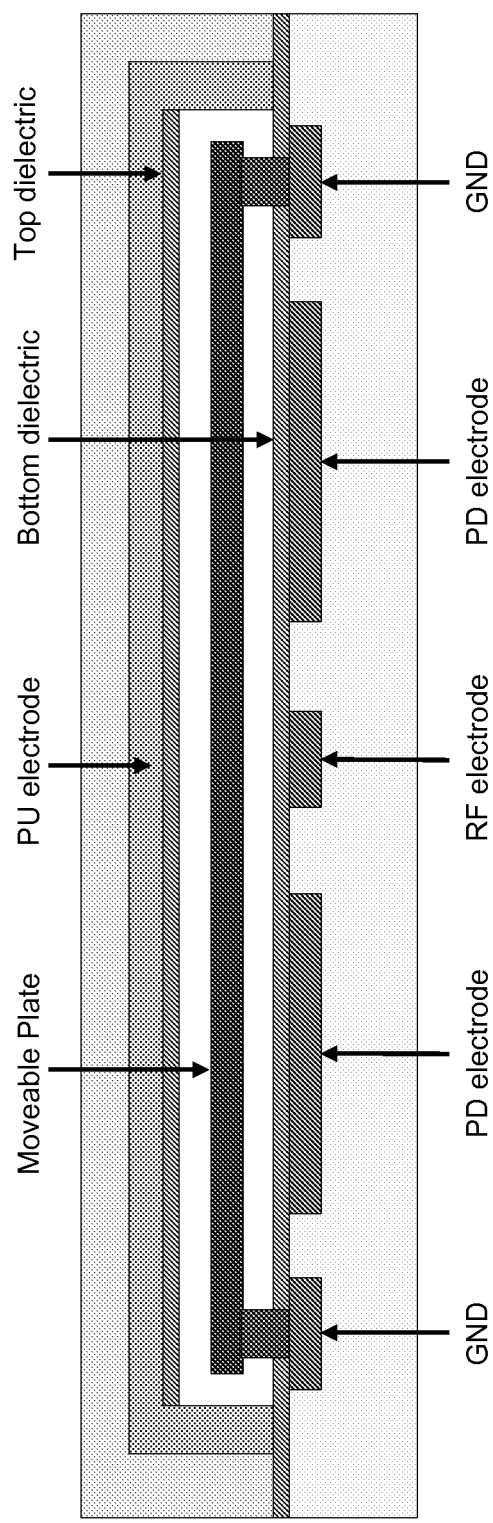
FIG. 1 is a schematic cross-sectional illustration of a MEMS DVC in the free standing state.
Figure 2:
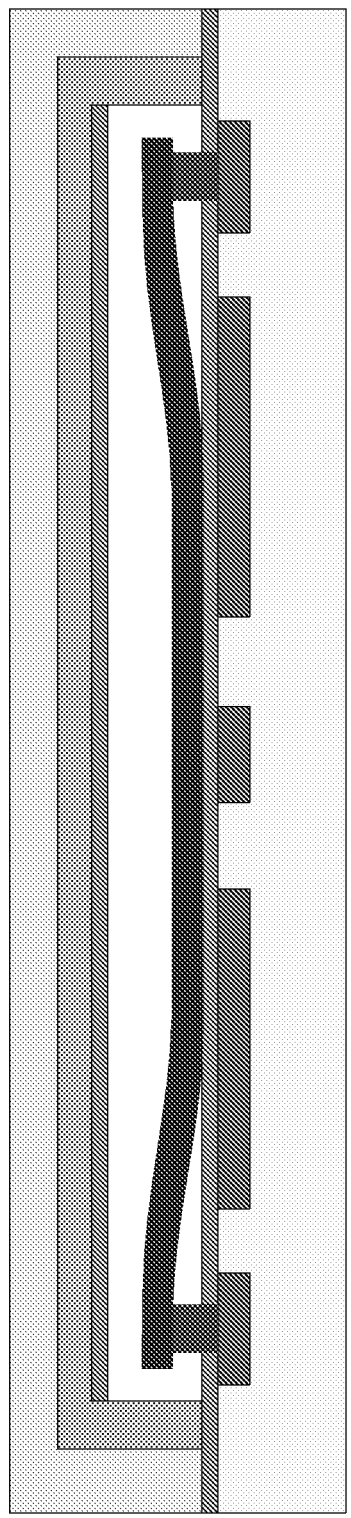
FIG. 2 is a schematic cross-sectional illustration of the MEMS DVC of FIG. 1 in the $C_{max}$ state.
Figure 3:
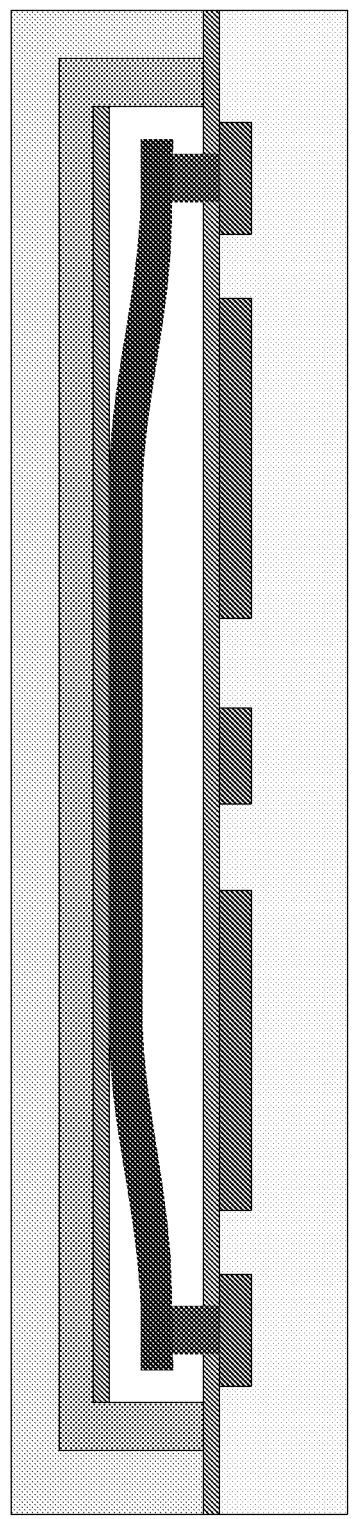
FIG. 3 is a schematic cross-sectional illustration of the MEMS DVC of FIG. 1 in the $C_{min}$ state.
Figure 4:
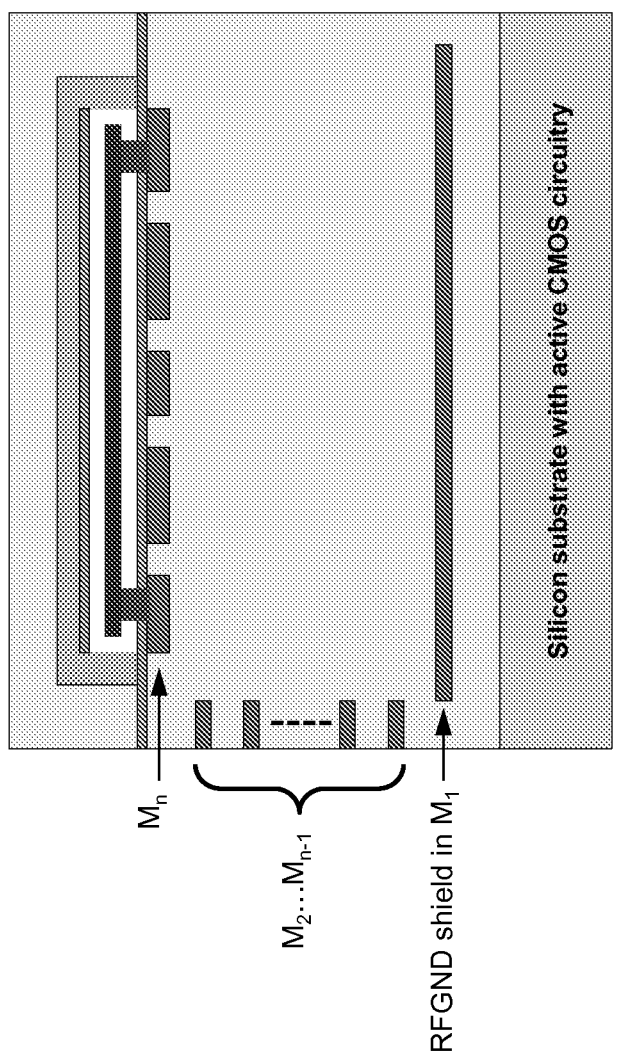
FIG. 4 is a schematic cross-sectional illustration of a MEMS DVC device with an M1 ground shield underneath the MEMS device to shield the silicon substrate from the RF.
Figure 5:
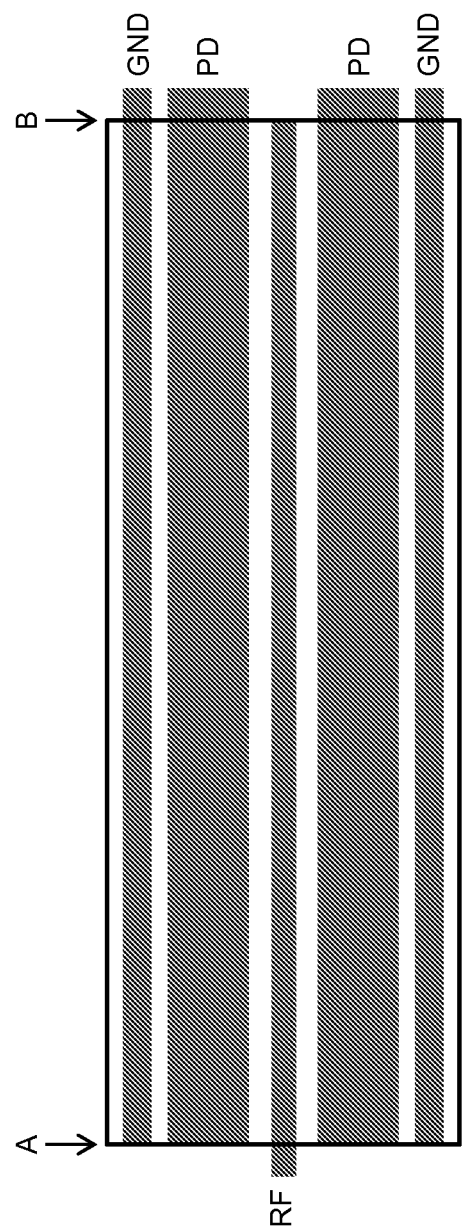
FIG. 5 is a schematic top-view of a MEMS DVC cell with the RF connection on a first side of the cell and the ground and pull-down connections on the opposite side of the cell.
Figure 6:
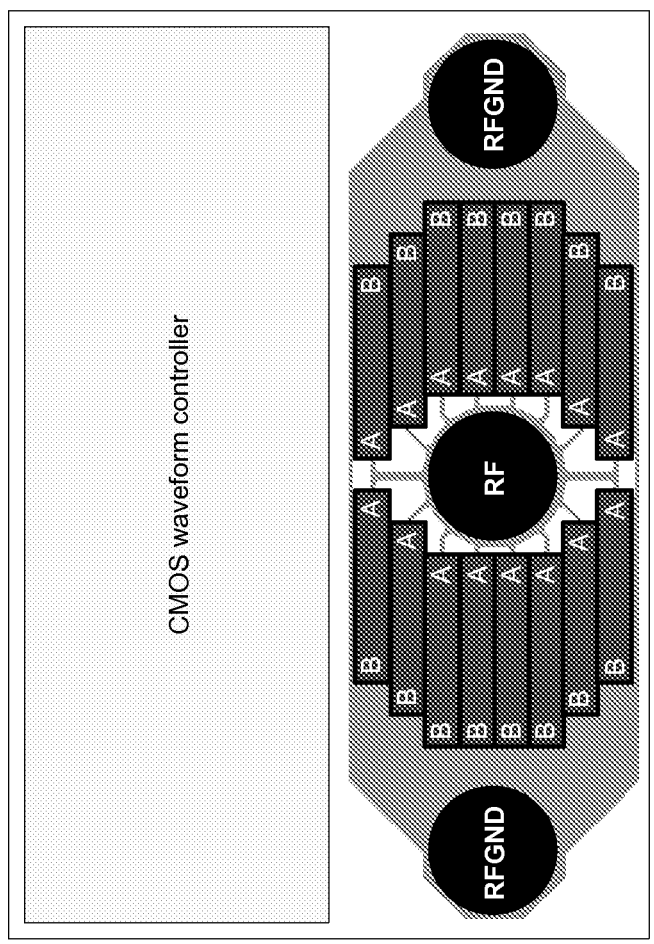
FIG. 6 is a schematic top-view of a DVC-chip with MEMS DVC cells arranged around an RF-pin and a CMOS waveform controller located on the same chip.
Figure 7:
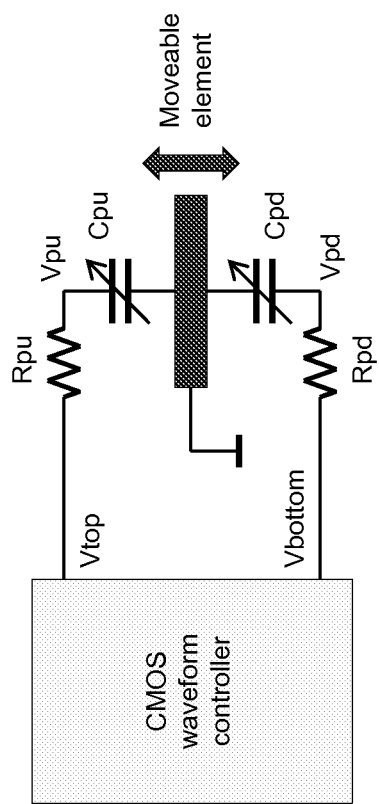
FIG. 7 is a schematic illustration of the electrical connection of a MEMS DVC with poly-resistors Rpu and Rpd.
Figure 8:
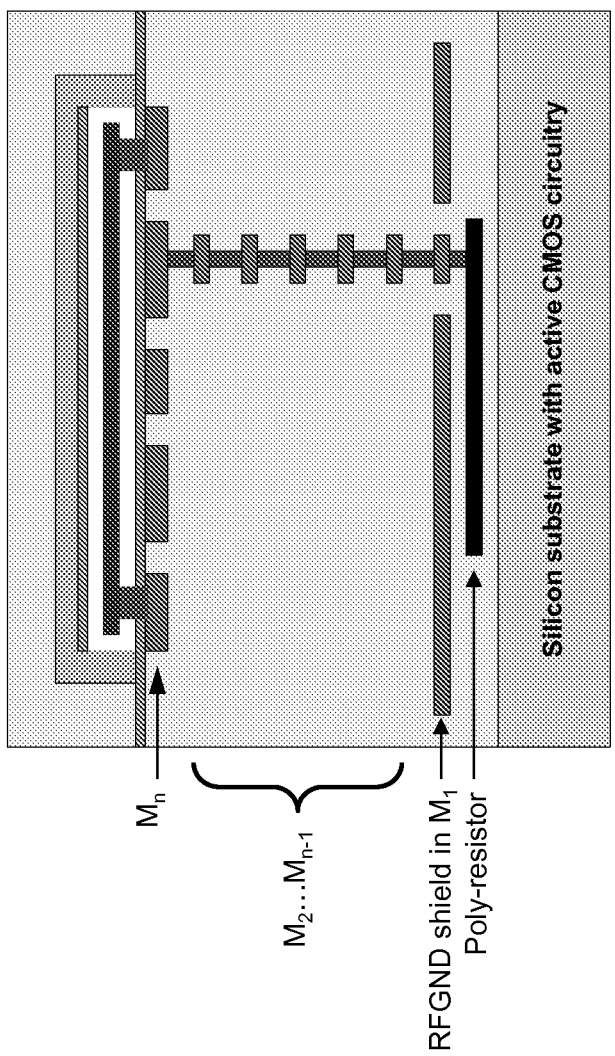
FIG. 8 is a schematic cross-sectional illustration of a MEMS DVC near a side of the cell with the connection of the pull-down electrode to the poly-resistor.
Figure 9:
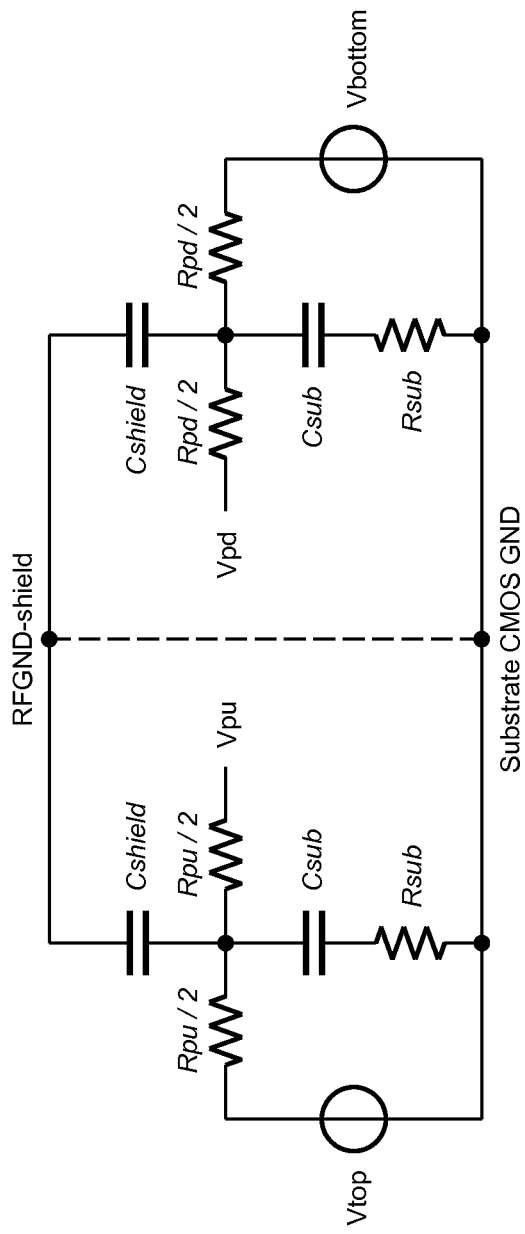
FIG. 9 is a circuit diagram of the MEMS DVC of FIG. 8.
Figure 10:
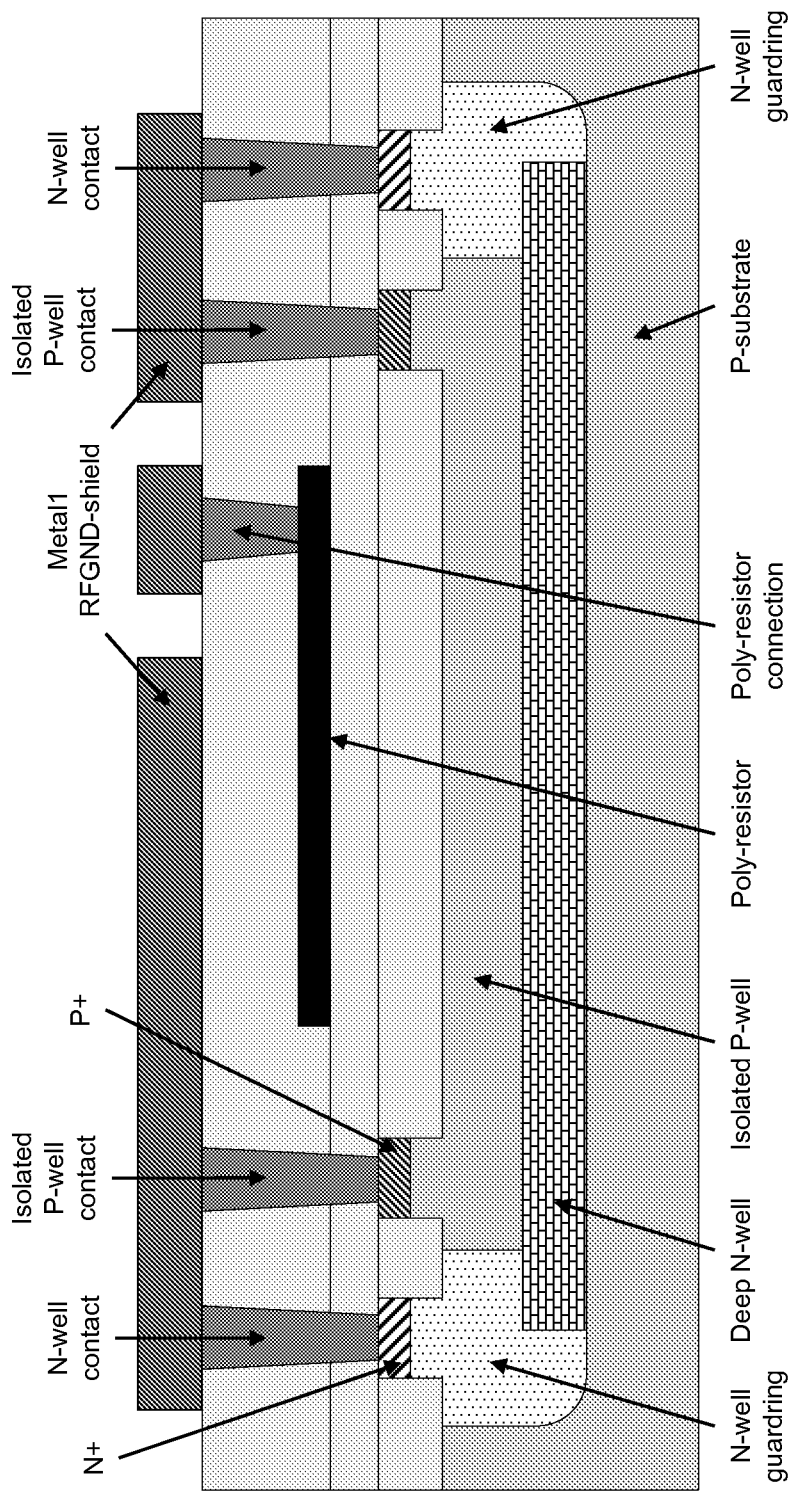
FIG. 10 is a schematic cross-sectional illustration of an isolated p-well underneath a poly-resistor in a MEMS DVC.

FIG. 10 shows one embodiment of the invention, where an isolated P-well underneath the poly-resistors is used which is electrically connected to the metal1 RFGND-shield located above the poly-resistor. For simplicity the metal layers above have been omitted but it is to be understood that additional metal layers, such as those shown in FIG. 4, may be present. The isolated P-well is commonly available in triple-well CMOS processes. The poly-resistor is surrounded by a complete N-well guard-ring. A deep N-well implant is used to create an isolated P-well which is surrounded on the bottom and on the sides by an N-region. This allows the isolated P-well to be biased separately from the P-substrate underneath. This facilitates the connection of the isolated P-well to the RFGND shield. The N-well and Deep N-well are also connected to the RFGND shield, effectively shorting the pn-diode of the isolated P-well and the N-well guardring.

Figure 11A:
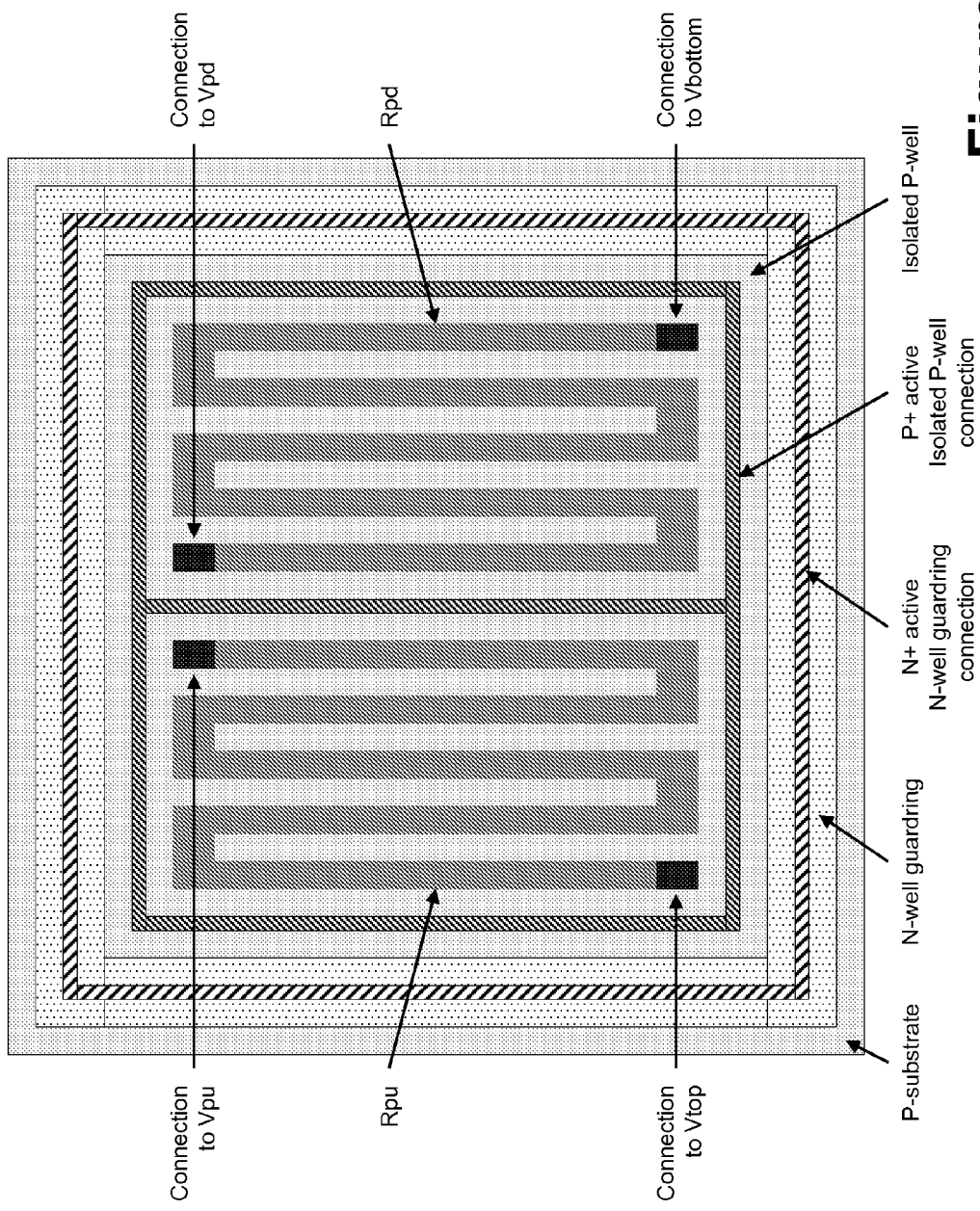
FIG. 11A is a schematic top view of the poly-resistors with an isolated p-well according to one embodiment.

FIG. 11A shows a top-view of the poly-resistors located above the isolated P-well. The Metal1 RFGND shield (omitted in FIG. 11A for clarity) connects to the N+ active connections of the N-well guard-ring and to the P+ active connections of the isolated P-well. It contains holes to provide access to the poly-resistor connections (Vtop, Vbottom, Vpu, Vpd).

A P+ active isolated P-well connection is surrounding each poly-resistor to pick up any current coupled into the isolated P-well and redirects this current to the Metal1

Figure 11B:
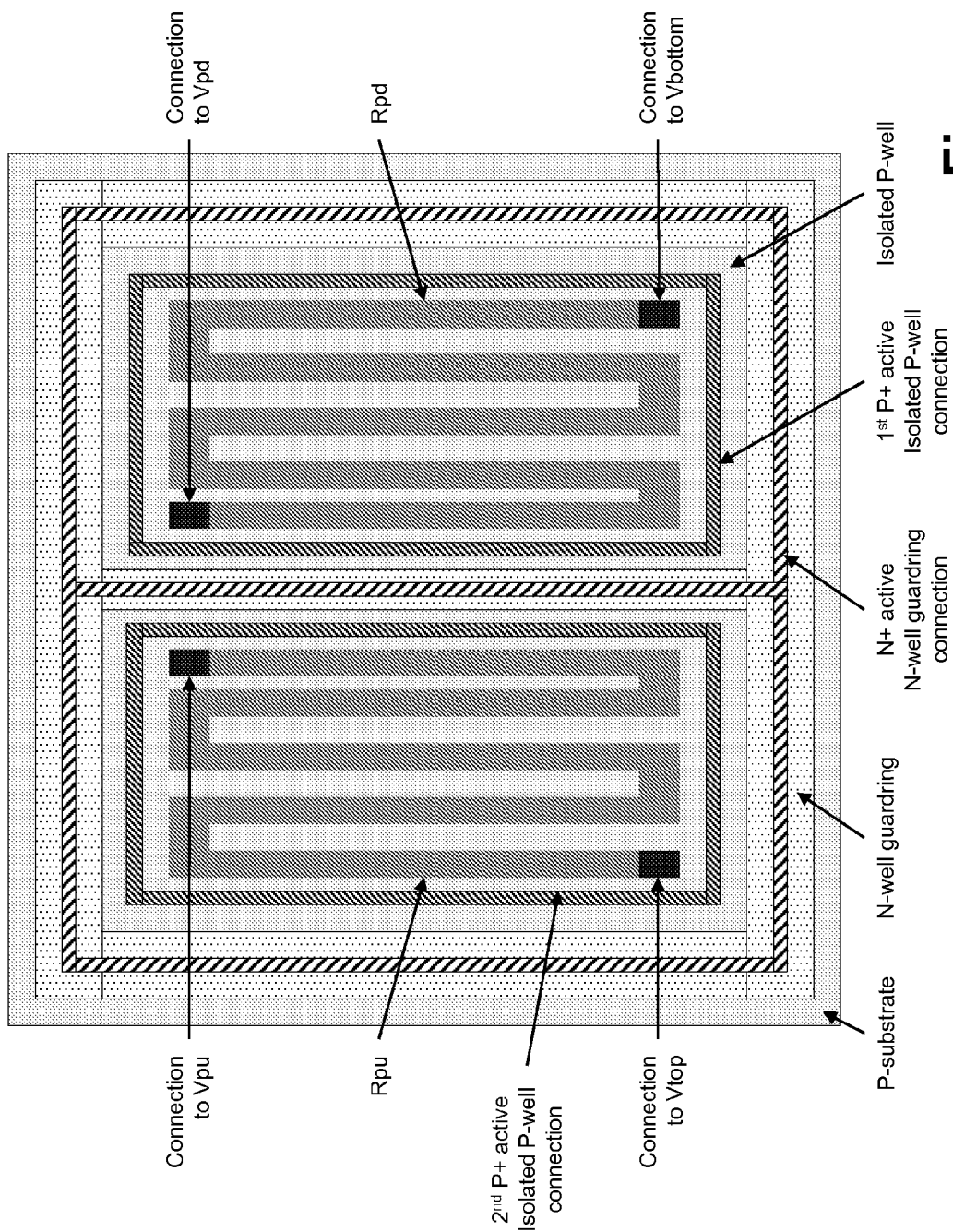
FIG. 11B is a schematic top view of the poly-resistors with an isolated p-wells according to another embodiment.

RFGND-shield. Both poly-resistors of the DVC-cell (Rpu, Rpd) share the same isolated P-well. In an alternative implementation shown in FIG. 11B, each resistor could also be positioned inside a separate isolated P-well.

Figure 12:
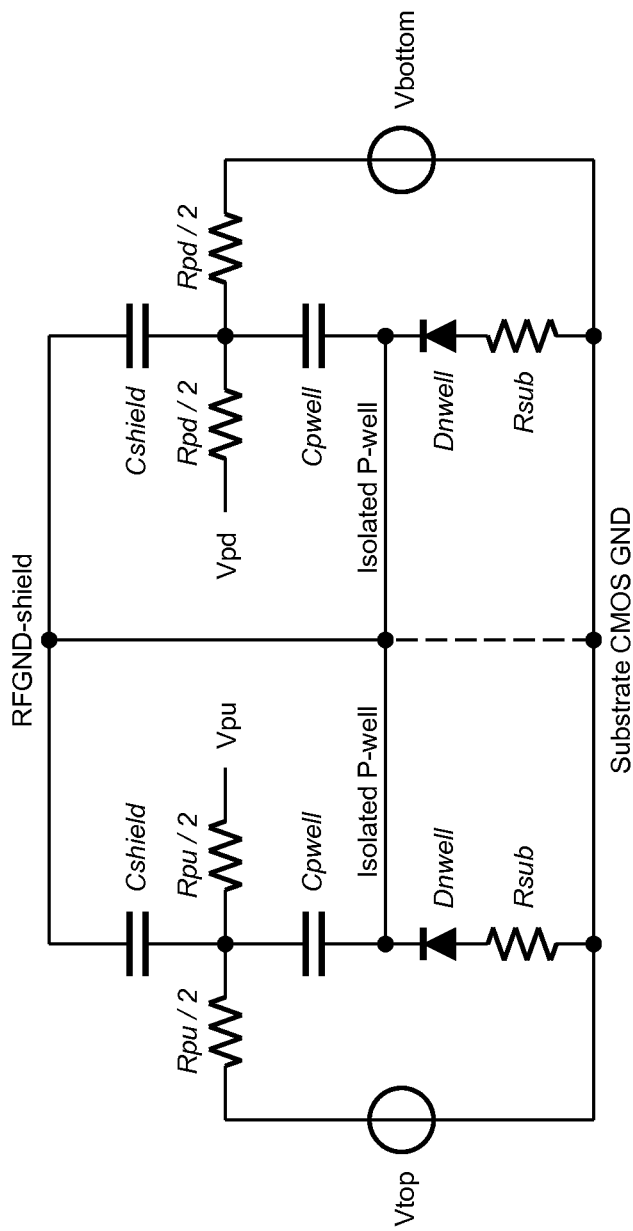
FIG. 12 is a circuit diagram of the MEMS DVC of FIG. 10.

FIG. 12 shows a simplified equivalent electrical circuit model of the poly-resistors Rpu, Rpd with parasitic capacitors Cshield to the RFGND-shield and parasitic capacitors Cpwell to the isolated P-well underneath. Any current coupled from the poly-resistor to the isolated P-well through Cpwell is now directly coupled to the RFGND via the isolated P-well contact. Because the RFGND is connected to the CMOS ground either inside or outside the chip (indicated by the dotted line) the substrate resistance Rsub no longer influences the dynamic behavior and each DVC cell will behave similarly independent of its location in the chip. The substrate contacts can therefore be located in the CMOS region of the chip and do not have to be placed near the MEMS cell.

Any CMOS noise in the substrate has to travel some distance through Rsub before it reaches the poly-resistor region of each DVC cell. It will couple into the isolated P-well through the diode Dnwell between the substrate and the Nwell/deep-Nwell regions. However, because the isolated p-well and Nwell/deep-Nwell are coupled to RFGND and directly to the CMOS ground outside the chip, this coupling has no influence on the spurious noise in the RF-electrode of the DVC device. Therefore the isolated P-well also provides for an improved noise performance of the DVC device.

Figure 13:
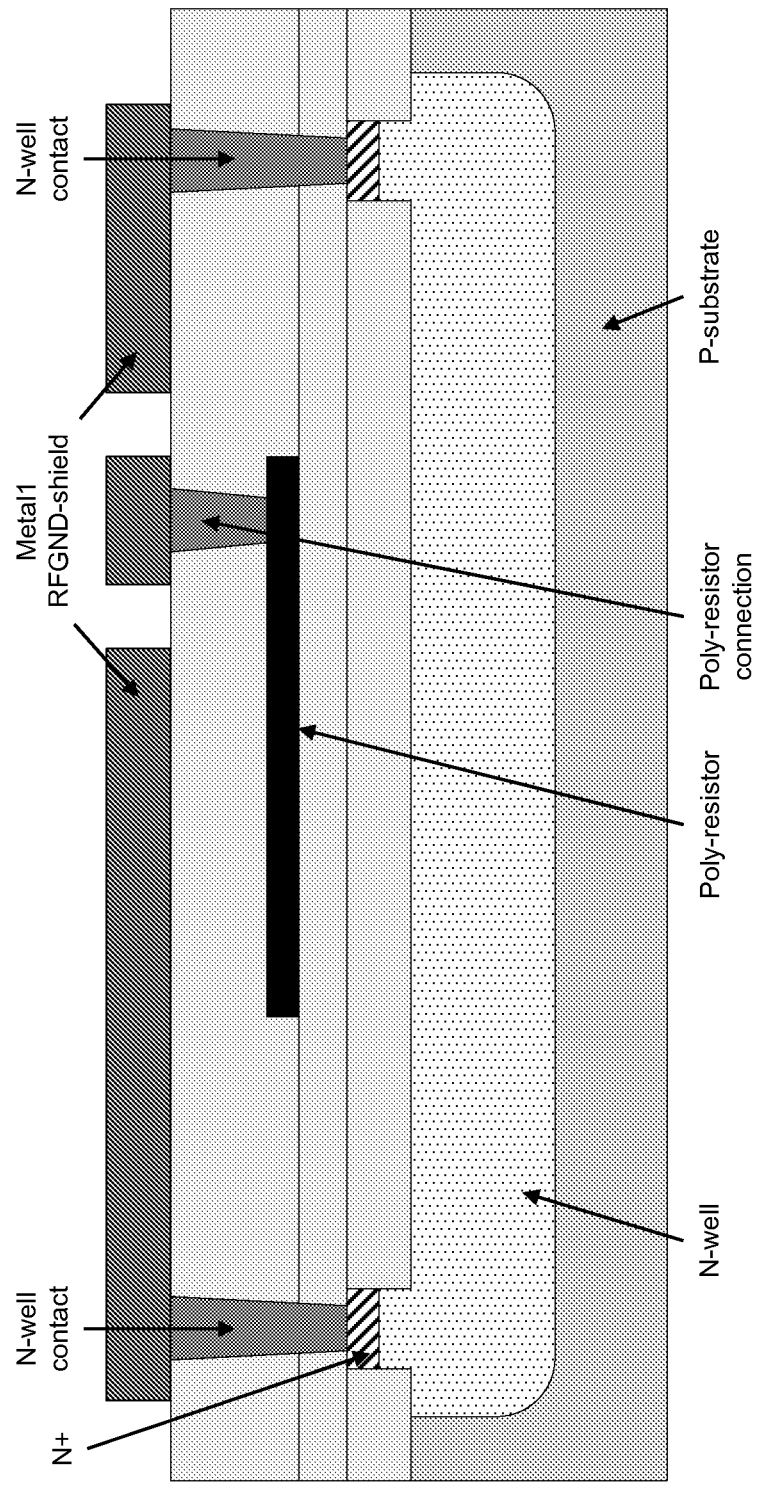
FIG. 13 is a schematic cross-sectional illustration of an isolated n-well underneath a poly-resistor in a MEMS DVC.

FIG. 13 shows another embodiment of the invention, where the isolated P-well underneath the poly-resistors is not present, but, rather, the N-well is used. The N-well is connected to the metal1 RFGND-shield located above the poly-resistor. For simplicity the metal layers above have been omitted but it is to be understood that additional metal layers, such as those shown in FIG. 4, may be present. The arrangement allows the N-well to be biased separately from the P-substrate underneath, which facilitates the connection of the N-well to the RFGND shield. As shown in FIG. 13, the n-well has an inner wall that isolates the two poly-resistors from one another.

Figure 14:
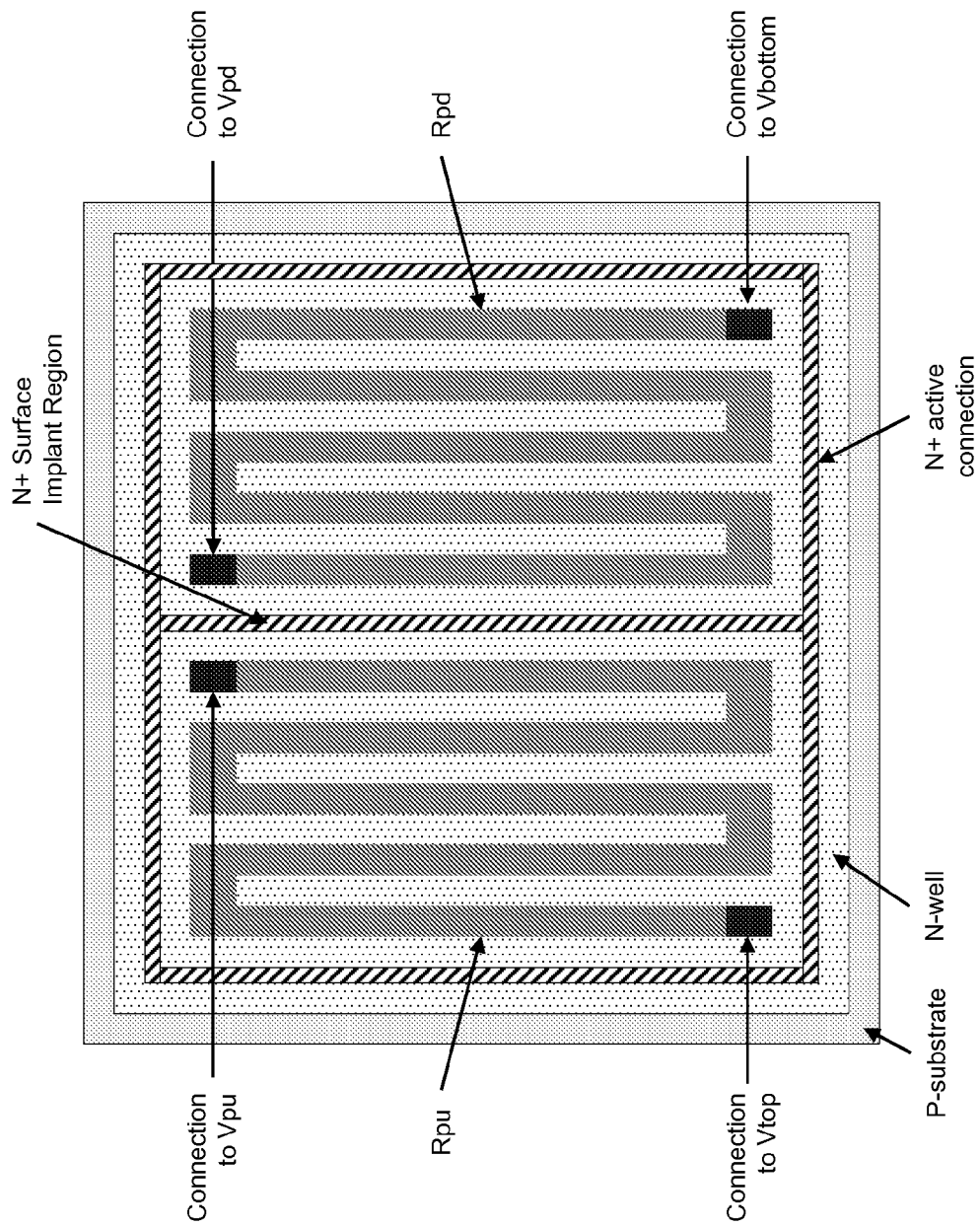
FIG. 14 is a schematic top view of the poly-resistors with an isolated n-well according to one embodiment.

FIG. 14 shows a top-view of the poly-resistors located above the N-well. The Metal1 RFGND shield (omitted in FIG. 14 for clarity) contains holes to provide access to the poly-resistor connections (Vtop, Vbottom, Vpu, Vpd). FIG. 14 also shows a surface implant region that is coupled to the N-well. The surface implant region is a very shallow surface n+ implant region that provides a low-ohmic connection to the N-well.

Figure 15:
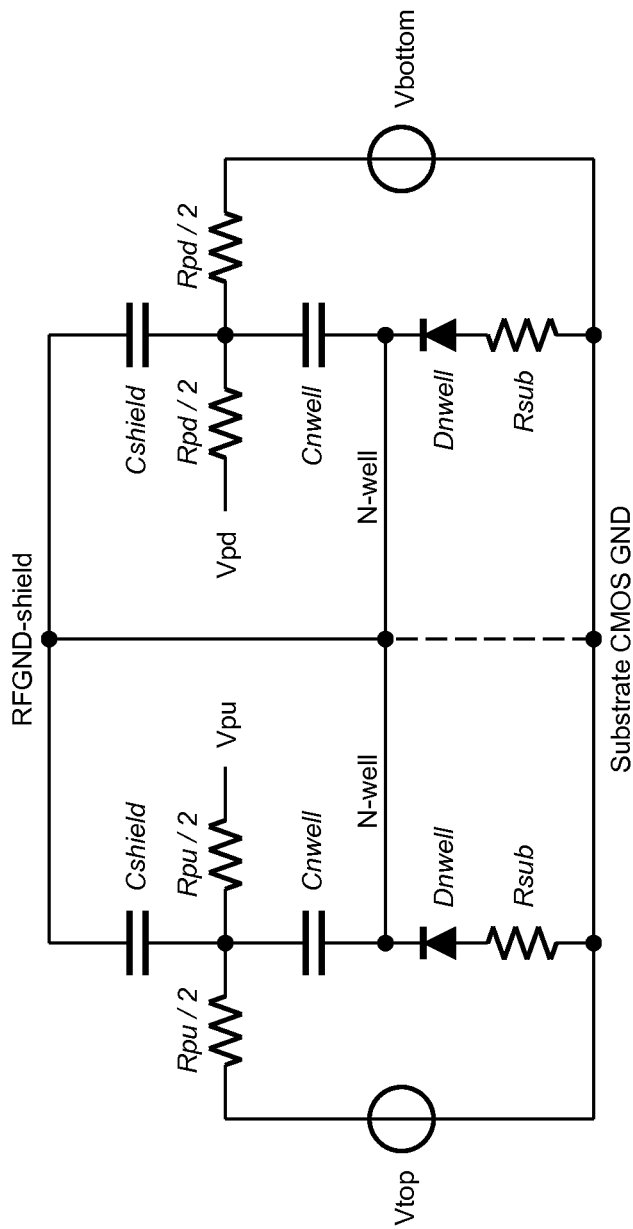
FIG. 15 is a circuit diagram of the MEMS DVC of FIG. 13.

FIG. 15 shows a simplified equivalent electrical circuit model of the poly-resistors Rpu, Rpd with parasitic capacitors Cshield to the RFGND-shield and parasitic capacitors Cnwell to the N-well underneath. Any current coupled from the poly-resistor to the n-well through Cnwell is now directly coupled to the RFGND. Because the RFGND is connected to the CMOS ground either inside or outside the chip (indicated by the dotted line) the substrate resistance Rsub no longer influences the dynamic behavior and each DVC cell will behave similarly independent of its location in the chip. The substrate contacts can therefore be located in the CMOS region of the chip and do not have to be placed near the MEMS cell.

Any CMOS noise in the substrate has to travel some distance through Rsub before it reaches the poly-resistor region of each DVC cell. It will couple into the N-well through the diode Dnwell. However, because the N-well is coupled to RFGND and directly to the CMOS ground outside the chip, this coupling has no influence on the spurious noise in the RF-electrode of the DVC device. Therefore the N-well by itself without the isolated P-well also provides for an improved noise performance of the DVC device.

By coupling an N-well to RF ground, or coupling both the N-well and deep N-well and an isolated P-well to RF ground, the isolation between the RF and the CMOS is greatly improved, and any noise on the RF-signal is significantly reduced or even eliminated. Additionally, each MEMS cell will have an identical dynamic performance.

While the foregoing is directed to embodiments of the present invention, other and further embodiments of the invention may be devised without departing from the basic scope thereof, and the scope thereof is determined by the claims that follow.

The invention claimed is:

1. A MEMS DVC, comprising:
   a MEMS device disposed above a substrate, the MEMS device having one or more electrodes, a movable MEMS element disposed within a cavity, and an RF electrode disposed below the movable MEMS element;
   a first poly-resistor coupled to at least one of the one or more electrodes, wherein the first poly-resistor is disposed between the substrate and the MEMS device;
   an n-well disposed below the first poly-resistor;
   an RF ground shield disposed above the first poly-resistor;
   an n-well contact coupled to the n-well and ground shield, wherein the n-well contact surrounds the first poly-resistor.

2. The MEMS DVC of claim 1, wherein the first poly-resistor is coupled to a waveform controller.

3. The MEMS DVC of claim 1, further comprising a second poly-resistor coupled to a second electrode of the MEMS device.

4. The MEMS DVC of claim 1, wherein the RF ground shield is disposed between the first poly-resistor and the MEMS device.

5. The MEMS DVC of claim 1, wherein the n-well comprises:
   an n-well contact that is coupled to the RF ground shield;
   an n-well embedded within the substrate below the first poly-resistor; and
   an n+connection coupled between the n-well and the n-well contact.

6. The MEMS DVC of claim 2, wherein the first poly-resistor is coupled to a first electrode of the MEMS device.

7. The MEMS DVC of claim 3, wherein either:
   the n-well surrounds both the first poly-resistor and the second poly-resistor; or
   the n-well comprises a first n-well that surrounds the first poly-resistor and a second n-well that surrounds the second poly-resistor.

8. The MEMS DVC of claim 5, further comprising a second poly-resistor coupled to a second electrode of the MEMS device.

9. The MEMS DVC of claim 7, wherein the second poly-resistor is coupled to a waveform controller.

10. The MEMS DVC of claim 8, wherein either:
    the n-well surrounds both the first poly-resistor and the second poly-resistor; or
    the n-well comprises a first n-well that surrounds the first poly-resistor and a second n-well that surrounds the second poly-resistor.

11. The MEMS DVC of claim 9, wherein the n-well surrounds both the first poly-resistor and the second poly-resistor and wherein the MEMS DVC further comprises a surface implant region that is distinct from, but coupled to the n-well, wherein the surface implant region extends between the first poly-resistor and the second poly-resistor.

12. A MEMS DVC, comprising:
   a MEMS device disposed above a substrate, the MEMS device having one or more electrodes, a movable MEMS element disposed within a cavity, and an RF electrode disposed below the movable MEMS element;
   a first poly-resistor coupled to at least one of the one or more electrodes, wherein the first poly-resistor is disposed between the substrate and the MEMS device;
   an n-well surrounding the first poly-resistor; and
   an RF ground shield coupled to the n-well wherein the n-well comprises:
      an n-well contact that is coupled to the RF ground shield;
      an n-well embedded within the substrate below the first poly-resistor; and
      an n+connection coupled between the n-well and the n-well contact, further comprising a second poly-resistor coupled to a second electrode of the MEMS device, wherein either:
         the n-well surrounds both the first poly-resistor and the second poly-resistor; or
         the n-well comprises a first n-well that surrounds the first poly-resistor and a second n-well that surrounds the second poly-resistor, wherein the n-well surrounds both the first poly-resistor and the second poly-resistor and wherein the MEMS DVC further comprises a surface implant region that is distinct from, but coupled to the n-well, wherein the surface implant region extends between the first poly-resistor and the second poly-resistor.

13. The MEMS DVC of claim 12, wherein the first poly-resistor has a first end and a second end, wherein the first end is coupled to an electrode of the MEMS device.

14. The MEMS DVC of claim 13, wherein the second poly-resistor has a first end and a second end, wherein the first end is coupled to another electrode of the MEMS device.

15. The MEMS DVC of claim 14, wherein the first poly-resistor is coupled to a waveform controller.

16. The MEMS DVC of claim 15, wherein the second poly-resistor is coupled to the waveform controller.

17. A MEMS DVC, comprising:
   a substrate;
   a MEMS device disposed above the substrate, the MEMS device having an RF electrode, and one or more other electrodes, and a movable MEMS element disposed within a cavity and above the RF electrode;
   a poly-resistor disposed between the substrate and the MEMS device and coupled to the MEMS device;
   an RF ground shield disposed between the MEMS device and the poly-resistor;
   a p-well contact, wherein the p-well contact is coupled to the RF ground shield;
   an isolated p-well coupled to the p-well contact and disposed between the substrate and the poly-resistor, wherein the p-well contact and the isolated p-well surround the poly-resistor;
   an n-well contact, wherein the n-well contact is coupled to the RF ground shield; and
   an n-well coupled to the n-well contact and disposed between the substrate and the isolated p-well, wherein the n-well contact and the n-well surround the p-well contact and the isolated p-well.

18. The MEMS DVC of claim 17, further comprising a waveform controller coupled to the poly-resistor.

19. The MEMS DVC of claim 17, wherein the poly-resistor is coupled to an electrode of the one or more other electrodes of the MEMS device.

20. The MEMS DVC of claim 18, further comprising a deep n-well that is coupled to the n-well and is disposed below the isolated p-well, wherein the deep n-well and the n-well isolate the p-well from the substrate.

* * * * *